May 5, 1964 R. E. ALLEN 3,131,459

METHOD OF BONDING ABSORBING MATERIAL TO A DELAY LINE

Filed Nov. 9, 1959

INVENTOR.
RICHARD E. ALLEN
BY Clarence R. Patty, Jr.
ATTORNEY

United States Patent Office 3,131,459
Patented May 5, 1964

3,131,459
METHOD OF BONDING ABSORBING MATERIAL TO A DELAY LINE

Richard E. Allen, Corning, N.Y., assignor to Corning Glass Works, Corning, N.Y., a corporation of New York Filed Nov. 9, 1959, Ser. No. 851,724
10 Claims. (Cl. 29—155.5)

This invention relates to the technique of bonding one body to another and more particularly to a cold diffusion method of bonding absorbing material to a solid ultrasonic delay line or to the transducer thereof.

In my co-pending application Serial No. 851,762 filed concurrently herewith entitled Delay Line Bond, and assigned to the same assignee as this application, I have described a novel crystal-to-delay line bond and the process for making it. The subject application is directed to the transducer backing that has particular applicability to the transducer assembly of said co-pending application. Additionally, it will be obvious to those skilled in the art that the same techniques may be applied to bonding absorber material to the delay line body.

Examples of prior delay line absorber or backing material bonding methods involve either a hot solder method or an electroplating method. The hot solder method, exemplified by British Patent No. 800,519, and issued to the assignee of the subject application, deals with swabbing a hot, molten solder on the crystal to wet the surface and further teaches the application of the backing material to the wetted crystal surface.

The other method in the absorber or backing material bonding art is set forth in Patent No. 2,859,515, issued to M. D. Fagen on November 4, 1958. This patent teaches the application of absorbing material to delay lines using a fired silver paste as a base coat on the crystal and then electroplating the back electrode or absorbing material over the silver paste.

Both methods, while satisfactory for small production runs, suffer from the defect of exposing the delay lines and crystals to high thermal shock as well as to excessive handling. Both of these defects are serious since they tend to produce a high number of rejections and consequently increase the cost per unit item.

Additionally, and in both instances, there is a good possibility that the backing material will flow through cracks or holes in the crystal to short the crystal and thereby produce an inoperative delay line.

I have found that I am able to overcome the inherent disadvantages of the prior art systems of bonding back electrode or absorbing material to crystals and delay lines by utilizing a novel cold diffusion method of bonding. This cold diffusion method of bonding is considerably more desirable and is based on the greater affinity of gold-to-indium than indium-to-indium.

In accordance with the foregoing, it becomes an important object of the instant invention to provide a cold diffusion method of bonding backing or absorber material to crystals or delay lines.

One other important object of the instant invention is to provide a cold diffusion method of bonding backing or absorber material to crystals or delay lines that provides considerably less breakage from thermal shock during assembly.

Another important object of the instant invention is to provide a cold diffusion method of bonding backing or absorber material to crystals or delay lines that is noted by its greater ease of assembly.

Yet another important object of the instant invention is to provide a cold diffusion method of bonding backing or absorber material to crystals or delay lines that is noted by its lower assembly costs.

Still another important object of the instant invention is to provide a cold diffusion method of bonding backing or absorber material to crystals or delay lines that provides a complete bond.

A further important object of the instant invention is to provide a cold diffusion method of bonding backing or absorber material to crystals or delay lines that is reproduceable from one delay line to another.

A still further important object of the instant invention is to provide a cold diffusion method of bonding backing or absorber material to crystals or delay lines that is relatively inexpensive and lends itself to a mass production type of assembly.

Another object of the instant invention is to provide a cold diffusion method of bonding backing or absorber material to crystals or delay lines that results in a considerable decrease in the number of transducer short circuits.

Other and more detailed objects of my invention, as well as further advantages thereof will become apparent to those skilled in the art from a consideration of the following specification and drawings in which.

In my co-pending application, I describe a method of successive crystal coatings wherein the outermost coating is a gold layer that has been rendered especially adherent by first depositing either successive layers of aluminum and nickel, or a single nickel-chromium layer on the crystal as an undercoat for the gold.

Figure 1:
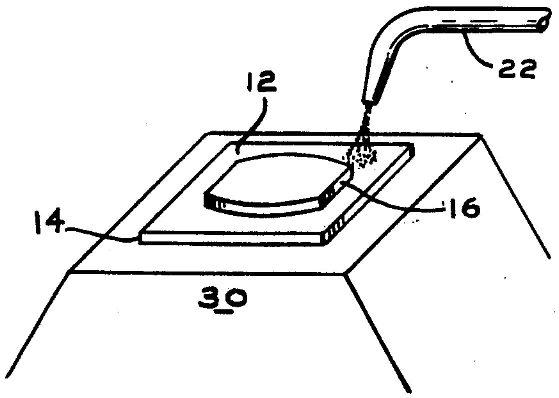
FIG. 1 is a step in my novel cold diffusion bonding process.
Figure 2:
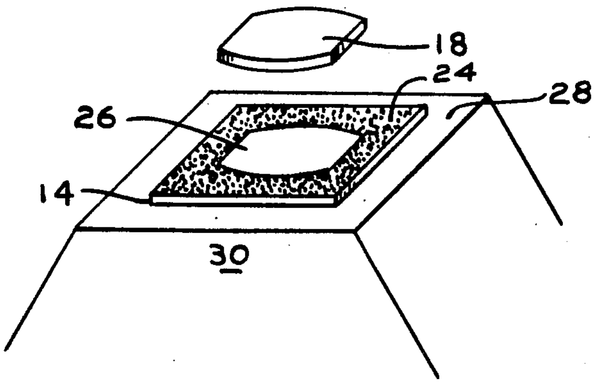
FIG. 2 is another step in my process, prior to final bonding.

Referring now to FIGS. 1 and 2, there is shown a typical adherent, gold coating 12 on the surface of the bonded transducer 14 of delay line 30. I now locate a mask 16 having the same configuration as the desired indium back electrode 18, in the proper position, on the back of the bonded transducer 14. This mask may be held in place with rubber bands or any other suitable holding means, not shown. The aluminum, nickel and gold coatings 12 outside the boundaries of the mask 16 on the back of the transducer 14 are removed by gently sandblasting the surface as indicated by nozzle 22. With all coatings now removed, and having an exposed surface 24 (FIG. 2) on the transducer, I remove the residue of sand by gently blowing clean air thereover. The shield is then removed and the coated portion 26 of the transducer back as well as the exposed portion 28 of the delay line 30 is first brushed using a clean camels hair brush or other similar soft material and is then brushed with a solvent such as carbon tetrachloride.

It should be here noted that the mask 16 is shaped to conform to the desired configuration of the back electrode 18. This shape is determined by the desired acoustical properties and characteristics in accordance with principles well known to those skilled in the delay line art.

A piece of indium back electrode 18, no larger than the crystal but large enough to cover masked area 26, flat on both sides and having the desired thickness is cleaned in a cleaning solution which may consist of about ⅓ hydrofluoric acid, ⅓ nitric acid and about ⅓ water. The indium back electrode is then rinsed in running tap water, dried, and finally gently burnished, preferably with nylon parachute cloth wrapped around the finger. The burnished indium is then pressed onto the previously masked area 26 of the transducer 14 and maintained at a pressure of about 180 pounds per square inch and a temperature of about 150° C. A jig or vise is used to hold the backing material against the transducer. Once pressure is applied, it is preferably maintained in a vacuum of about 20 microns of mercury or less for approximately 16 hours. While maintaining the jig in a vacuum is preferable, I find that it is also possible to achieve good results if the bonding is done at atmospheric pressure in some inert atmosphere such as nitrogen or helium for example.

After the bonding is complete, the exact shape and position of the back electrode is now scribed on the exposed portion of the indium back electrode and the excess material is cut away with a sharp razor blade. This cutting operation is quite simple since the indium does not adhere to the sandblasted surface of the crystal.

The above-described process is admirably adapted to very thin crystals which may range in thickness from .008–.002 inches. However, another embodiment, which finds particular applicability to thicker, low frequency crystals is as follows:

Instead of initially masking and sandblasting, it is possible to achieve the same end result by applying the indium strip directly to the gold layer on the transducer surface and heating and applying pressure as previously described. Thereafter, an outline of the desired configuration of back electrode is scribed on the strip and the excess indium, which would fall outside of the desired shape of the back electrode, is carefully scraped away until the gold surface is reached. At this point, the gold surface of the transducer as well as the exposed delay line facet surface is cleaned by sandblasting, as before, thereby producing the desired, shaped back electrode.

While I have described my process in terms of applying a back electrode to a delay line transducer it will be obvious to those skilled in the art that the same technique may be utilized to apply a series of acoustic absorbers or "stops" at strategic corners of a multi-facet delay line to absorb signals that diverge unduly from the prescribed path.

While I have described what are presently considered the preferred embodiments of my invention, it will be obvious to those skilled in the art that various other changes and modifications may be made therein without departing from the inventive concept contained herein, and it is therefore, aimed in the appended claims, to cover all such changes and modifications that fall within the true spirit and scope of my invention.

What is claimed is:

1. A cold diffusion process for bonding a back electrode to a crystal comprising the steps of providing a crystal having a plurality of metallic layers selected from the group consisting of: (1) successive layers of aluminum, nickel, and gold, and (2) successive layers of nickel-chromium and gold bonded to each other and to a surface thereof, the outer layer being gold, cleaning the gold layer, providing a back electrode consisting essentially of indium, cleaning the mating surface of said back electrode, disposing said mating surface adjacent said gold layer, heating the assembly so formed to a temperature of about 150° C. while applying a pressure thereto of approximately 180 pounds per square inch, and thereafter removing the excess indium about the periphery of said back electrode.

2. The process of claim 1 comprising the further steps of masking a selected portion of said plurality of metallic layers and removing the unmasked portion thereof prior to cleaning said gold layer.

3. The process of claim 2 wherein said unmasked portion is removed by sandblasting.

4. The process of claim 1 wherein selected portions of said back electrode and corresponding portions of said plurality of metallic layers are removed after said back electrode is bonded to said crystal.

5. A cold diffusion process for bonding an acoustic absorber to a delay line facet comprising the steps of providing a delay line having a plurality of metallic layers bonded to each other and to a facet thereof, the metallic layers selected from the group consisting of: (1) successive layers of aluminum, nickel, and gold, and (2) successive layers of nickel-chromium, and gold, the outer layer being gold, cleaning the gold layer, providing a strip of acoustic absorber material consisting essentially of indium, cleaning the mating surface of said absorber material, disposing said mating surface adjacent said gold layer, heating the assembly so formed to a temperature of about 150° C. while applying a pressure thereto of approximately 180 pounds per square inch, and thereafter removing the excess indium about the periphery of said acoustic absorber.

6. The process of claim 5 comprising the further steps of masking a selected portion of said plurality of metallic layers and removing the unmasked portion thereof prior to cleaning said gold layer.

7. The process of claim 6 wherein said unmasked portion is removed by sandblasting.

8. The process of claim 5 wherein selected portions of said absorber material and corresponding portions of said plurality of metallic layers are removed after said absorber material is bonded to said delay line facet.

9. A cold diffusion process for bonding a back electrode to a crystal comprising the steps of providing a crystal having a layer of gold bonded to a surface thereof, cleaning the gold layer, providing a back electrode consisting essentially of indium, cleaning the mating surface of said back electrode, disposing said mating surface adjacent said gold layer, heating the assembly so formed to a temperature of about 150° C. while applying a pressure thereto of approximately 180 pounds per square inch, and thereafter removing the excess indium about the periphery of said back electrode.

10. A cold diffusion process for bonding an acoustic absorber to a delay line facet comprising the steps of providing a delay line having a layer of gold bonded to a facet thereof, cleaning the gold layer, providing a strip of acoustic absorber material consisting essentially of indium, cleaning the mating surface of said absorber material, disposing said mating surface adjacent said gold layer, heating the assembly so formed to a temperature of about 150° C. while applying a pressure thereto of approximately 180 pounds per square inch, and thereafter removing the excess indium about the periphery of said acoustic absorber.

References Cited in the file of this patent

UNITED STATES PATENTS

| | | |
|---|---|---|
| 385,783 | Whiting | July 10, 1888 |
| 2,478,037 | Brennan | Aug. 2, 1949 |
| 2,570,248 | Kelley | Oct. 9, 1951 |
| 2,848,359 | Talmey | Aug. 19, 1958 |
| 2,859,415 | Fagen | Nov. 4, 1958 |
| 2,877,431 | McSkimin | Mar. 10, 1959 |
| 2,937,960 | Pankove | May 24, 1960 |
| 2,964,839 | Marafioti et al. | Dec. 20, 1960 |
| 3,006,067 | Anderson et al. | Oct. 31, 1961 |
| 3,011,067 | Bray | Nov. 28, 1961 |
| 3,025,479 | Wolfskill | Mar. 13, 1962 |
| 3,042,550 | Allen et al. | July 3, 1962 |
| 3,046,651 | Olmon et al. | July 31, 1962 |
| 3,032,869 | Hochman | Oct. 9, 1962 |

FOREIGN PATENTS

| | | |
|---|---|---|
| 800,519 | Great Britain | Aug. 27, 1958 |

OTHER REFERENCES

The Review of Scientific Instruments, vol. 25 No. 2, February 1954, pp. 180–183, article by Belser.